(12) United States Patent
Kihara (10) Patent No.: US 11,005,477 B2
(45) Date of Patent: May 11, 2021

(54) DRIVER CIRCUIT AND CONTROL METHOD THEREFOR, AND TRANSMISSION/RECEPTION SYSTEM

(71) Applicant: Sony Semiconductor Solutions Corporation, Kanagawa (JP)

(72) Inventor: Hiroki Kihara, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/326,576

(22) PCT Filed: Sep. 28, 2017

(86) PCT No.: PCT/JP2017/035192
§ 371 (c)(1),
(2) Date: Feb. 19, 2019

(87) PCT Pub. No.: WO2018/070261
PCT Pub. Date: Apr. 19, 2018

(65) Prior Publication Data
US 2019/0214994 A1 Jul. 11, 2019

(30) Foreign Application Priority Data
Oct. 12, 2016 (JP) .................................. 2016-200644

(51) Int. Cl.
*H03K 19/0175* (2006.01)
*H03K 19/0185* (2006.01)
(Continued)

(52) U.S. Cl.
CPC . *H03K 19/018528* (2013.01); *H03K 19/0175* (2013.01); *H03K 19/0948* (2013.01); *H04B 1/44* (2013.01); *H04L 25/02* (2013.01)

(58) Field of Classification Search
CPC ....... H03K 19/0175; H03K 19/018528; H03K 19/0948; H04B 1/44; H04L 25/02
See application file for complete search history.

(56) References Cited

U.S. PATENT DOCUMENTS 6,407,609 B1   6/2002  Aggarwal et al.
6,437,610 B1 * 8/2002  Schrodinger .... H03K 19/00384
                                                    326/30
(Continued)

OTHER PUBLICATIONS

S. Palermo, "ECEN720: High-Speed Links Circuits and Systems Spring 2017," Lecture 5: Termination, TX Driver, & Multiplexer Circuits, 2017, pp. 1-42, Analog & Mixed-Signal Center Texas A&M University.

*Primary Examiner* — Alexander H Taningco
*Assistant Examiner* — Kurtis R Bahr
(74) *Attorney, Agent, or Firm* — Michael Best & Friedrich LLP (57) ABSTRACT

The present technology relates to a driver circuit, a control method therefor, and a transmission/reception system that enable implementation of a large amplitude signal output required for long distance transmission with low power consumption. The driver circuit includes: a current drive circuit that outputs a predetermined current; and a termination resistance circuit connected in parallel with the current drive circuit, in which the termination resistance circuit connects a termination resistance to a transmission line when the current drive circuit outputs a current, and disconnects the termination resistance from the transmission line when the current drive circuit does not output the current. The present technology can be applied to, for example, a driver circuit that outputs a signal to a long distance transmission line, and the like.

8 Claims, 11 Drawing Sheets

(51) Int. Cl.
*H04B 1/44* (2006.01)
*H03K 19/0948* (2006.01)
*H04L 25/02* (2006.01)

(56) References Cited

U.S. PATENT DOCUMENTS

| | | | |
|---|---|---|---|
| 6,566,891 B1 | 5/2003 | Aggarwal et al. | |
| 7,443,211 B2* | 10/2008 | Liu .................... | H03K 5/1534 |
| | | | 326/30 |
| 7,969,197 B2* | 6/2011 | Muraoka ........ | H03K 19/018521 |
| | | | 326/86 |
| 7,999,595 B2* | 8/2011 | Namkoong .... | H03K 19/018528 |
| | | | 327/306 |
| 2002/0030517 A1* | 3/2002 | Kurisu ............. | H03K 19/01858 |
| | | | 327/108 |
| 2003/0076136 A1* | 4/2003 | McCorkle ................ | H03K 5/05 |
| | | | 327/112 |
| 2003/0193351 A1* | 10/2003 | Fukui .............. | H03K 19/01721 |
| | | | 326/83 |
| 2005/0258870 A1* | 11/2005 | Mitby ................ | H04L 25/0288 |
| | | | 326/87 |

\* cited by examiner

DRIVER CIRCUIT AND CONTROL METHOD THEREFOR, AND TRANSMISSION/RECEPTION SYSTEM

TECHNICAL FIELD

The present technology relates to a driver circuit and a control method therefor, and a transmission/reception system, and more particularly to a driver circuit and a control method therefor, and a transmission/reception system that are enabled to implement a large amplitude signal output required for long distance transmission with low power consumption.

BACKGROUND ART

In a high-speed communication for a large attenuation transmission line such as a backplane of a server and the like, or a medium-to-long distance cable such as a high-definition multimedia interface (HDMI) (registered trademark) cable, current mode logic (CML) is used as a driver circuit, for example (see Non-Patent Document 1, for example).

CML is used in many high-speed communication standards such as PCIe, USB 3.0; however, since a through-current flows, there is a problem that current consumption is large. To cope with this, for products requiring low power consumption such as mobile devices, NMOS Push Pull is used recently that has no through-current and has low power consumption. However, in NMOS Push Pull, the Hi level is limited by Vgs−Vth of Push NMOS, so that it is difficult to expand the amplitude and it is considered unsuitable for long distance transmission.

CITATION LIST

Non-Patent Document

Non-Patent Document 1: <URL: http://www.ece.tamu.edu/~spalermo/ecen689/lecture5_ee720_termination_txdriver.pdf>, [search on Sep. 12, 2016]

SUMMARY OF THE INVENTION

Problems to be Solved by the Invention

In recent years, as the sensor network progresses, it is predicted that cases increase where signals are transmitted over medium to long distance from devices with high data rate such as image sensors, and there is a need for a technology to implement the transmission with low power consumption.

The present technology has been made in view of such a situation, and it is intended to implement a large amplitude signal output required for long distance transmission with low power consumption.

Solutions to Problems

A driver circuit of a first aspect of the present technology includes: a current drive circuit that outputs a predetermined current; and a termination resistance circuit connected in parallel with the current drive circuit, in which the termination resistance circuit connects a termination resistance to a transmission line when the current drive circuit outputs a current, and disconnects the termination resistance from the transmission line when the current drive circuit does not output the current.

A method for controlling a driver circuit of a second aspect of the present technology, the driver circuit including: a current drive circuit that outputs a predetermined current; and a termination resistance circuit connected in parallel with the current drive circuit, the method includes connecting a termination resistance to a transmission line when the current drive circuit outputs a current, and disconnecting the termination resistance from the transmission line when the current drive circuit does not output the current, by the termination resistance circuit.

A transmission/reception system of a third aspect of the present technology includes a transmission device and a reception device, in which the transmission device includes: a current drive circuit that outputs a predetermined current; and a termination resistance circuit connected in parallel with the current drive circuit, in which the termination resistance circuit connects a termination resistance to a transmission line when the current drive circuit outputs a current, and disconnects the termination resistance from the transmission line when the current drive circuit does not output the current.

In the first to third aspects of the present technology, there is provided a current drive circuit that outputs a predetermined current and a termination resistance circuit that is connected in parallel with the current drive circuit, in which in the termination resistance circuit, the termination resistance is connected to a transmission line when the current drive circuit outputs a current, and the termination resistance is disconnected from the transmission line when the current drive circuit does not output the current.

The driver circuit may be an independent device or an internal block included in one device.

Effects of the Invention

According to the first to third aspects of the present technology, it is possible to implement a large amplitude signal output required for long distance transmission with low power consumption.

Note that, the effect described here is not necessarily limited, and can be any effect described in the present disclosure.

MODE FOR CARRYING OUT THE INVENTION

The following is a description of a mode for carrying out the present technology (the mode will be hereinafter referred to as the embodiment). Note that, description will be made in the following order.
1. CML Circuit
2. NMOS Push Pull Circuit
3. First Embodiment of Driver Circuit
4. Second Embodiment of Driver Circuit
5. Third Embodiment of Driver Circuit
6. Fourth Embodiment of Driver Circuit
7. Fifth Embodiment of Driver Circuit
8. Sixth Embodiment of Driver Circuit
9. Overall Transmission/reception Diagram
10. Effect
11. Summary <1. CML Circuit>

Figure 1:
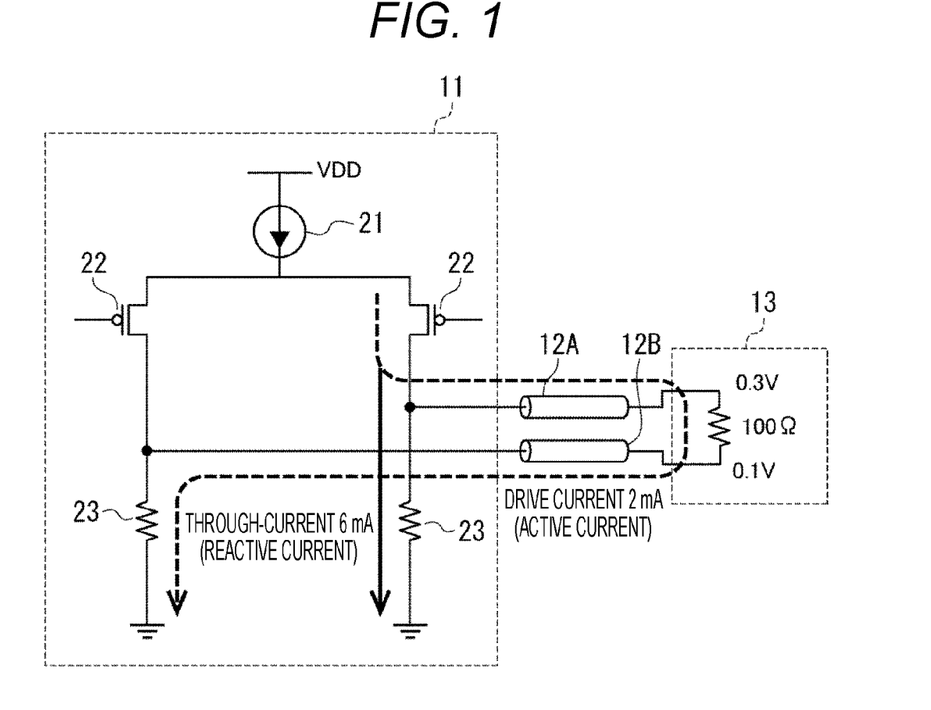
FIG. 1 is a diagram illustrating a configuration example of a driver circuit using CML.

FIG. 1 is a diagram illustrating a configuration example of a driver circuit using CML (hereinafter referred to as a CML circuit).

A CML circuit 11 of FIG. 1 includes a differential circuit including a current source 21, and two pairs of a drive transistor 22 and a load resistance 23 (hereinafter also referred to as a termination resistance 23) of 50Ω. The drive transistor 22 includes a PMOS transistor.

The CML circuit 11 transmits a differential signal having a predetermined amplitude to a receiver (not illustrated) via a differential transmission line 12 including transmission lines 12A and 12B. A termination circuit 13 of the receiver is terminated with a differential of 100Ω.

In a case where attenuation of the signal is large, the CML circuit 11 has an advantage that signal amplitude can be easily expanded by increasing a current caused to flow by the current source 21, but current consumption is large.

For example, in a case where a signal having an amplitude of 0.2 V is transmitted to the differential transmission line 12 in which the termination circuit 13 on the reception side is terminated with the differential of 100Ω, a current of 2 mA flows through the transmission lines 12A and 12B, and at the same time, a through-current of 6 mA flows through the termination resistance 23 of the CML circuit 11. The through-current of 6 mA is a current that does not contribute to communication and consumes ¾ of the current consumption ineffectively.

<2. NMOS Push Pull Circuit>

Figure 2:
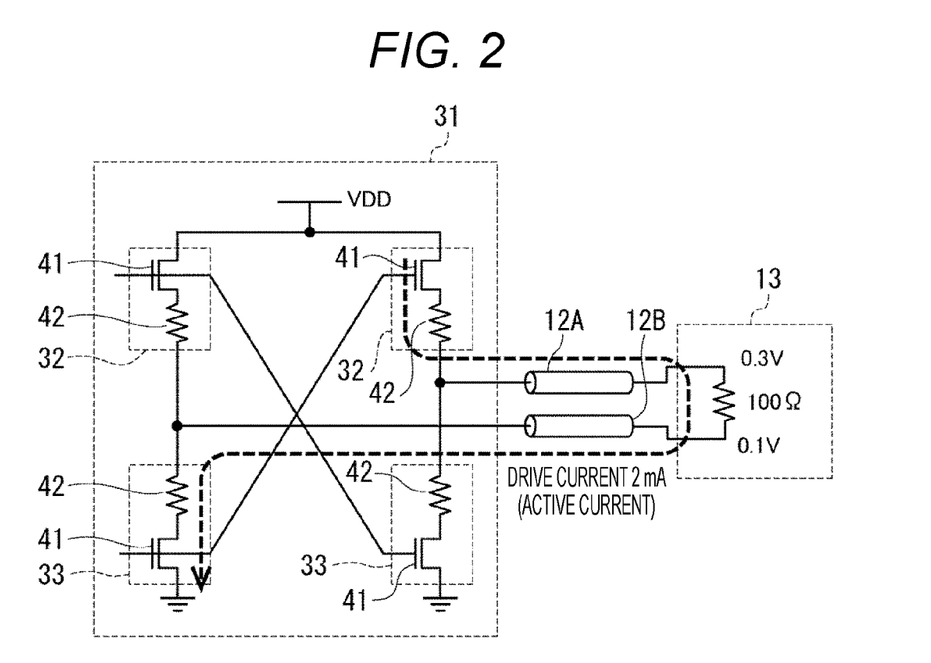
FIG. 2 is a diagram illustrating a configuration example of a driver circuit using NMOS Push Pull.

FIG. 2 is a diagram illustrating a configuration example of a driver circuit using NMOS Push Pull (hereinafter referred to as an NMOS Push Pull circuit).

An NMOS Push Pull circuit 31 in FIG. 2 includes a differential circuit including a pair of voltage drive circuits 32 arranged on the output Hi side and a pair of voltage drive circuits 33 arranged on the output Low side. Each of the voltage drive circuits 32 and 33 includes an NMOS transistor 41 and a resistance 42 that become a total of 50Ω.

In a case where a signal having an amplitude of 0.2 V is transmitted by using the NMOS Push Pull circuit 31 to the differential transmission line 12 in which the termination circuit 13 on the reception side is terminated with the differential of 100Ω similarly to FIG. 1, the through-current does not flow. However, the Hi level is limited by Vgs−Vth of the NMOS transistor 41 of the voltage drive circuit 32, so that it is difficult to expand the amplitude and it is considered unsuitable for long distance transmission.

<3. First Embodiment of Driver Circuit>

Figure 3:
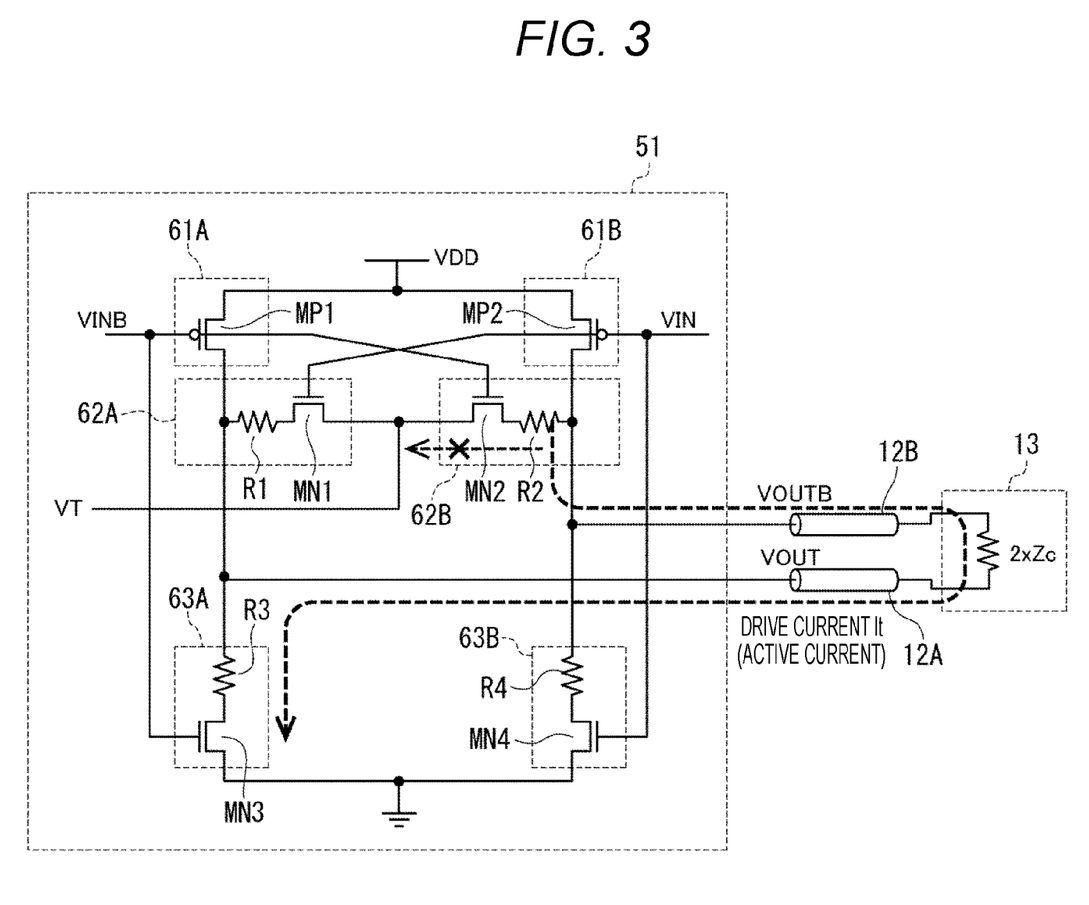
FIG. 3 is a diagram illustrating a configuration example of a first embodiment of a driver circuit to which the present technology is applied.

FIG. 3 illustrates a configuration example of a first embodiment of a driver circuit to which the present technology is applied.

A driver circuit 51 of FIG. 3 includes a differential circuit including a pair of current drive circuits 61A and 61B, a pair of termination resistance circuits 62A and 62B, and a pair of voltage drive circuits 63A and 63B.

The current drive circuit 61A includes a PMOS transistor MP1, the current drive circuit 61B includes a PMOS transistor MP2, and the current drive circuits 61A and 61B output predetermined currents. Each of the PMOS transistors MP1 and MP2 operates in the saturation region. By constituting the transistors included in the current drive circuits 61A and 61B by PMOS transistors, the Hi level of the output signal can be raised to a level close to a power supply voltage.

The termination resistance circuit 62A includes a resistance R1 and an NMOS transistor MN1 connected together in series, and functions as a termination resistance on the transmission side when the NMOS transistor MN1 as a switch is turned on. The termination resistance circuit 62B includes a resistance R2 and an NMOS transistor MN2 connected together in series, and functions as a termination resistance on the transmission side when the NMOS transistor MN2 as a switch is turned on.

Each of the NMOS transistors MN1 and NM2 operates in the linear region. The NMOS transistors MN1 and MN2 are connected to a termination potential VT, and the termination potential VT is equal to a potential of the Hi level of the output signal. Since a power supply voltage VDD and the termination potential VT can be regarded as being short-circuited in terms of AC, the current drive circuit 61A and the termination resistance circuit 62A are connected together in parallel. Similarly, the current drive circuit 61B and the termination resistance circuit 62B are also connected together in parallel.

The voltage drive circuit 63A includes an NMOS transistor MN3 and a resistance R3, the voltage drive circuit 63B includes an NMOS transistor MN4 and a resistance R4, and each of the NMOS transistors MN3 and NM4 operates in the linear region.

Thus, the voltage drive circuits 63A and 63B on the output Low side have a configuration similar to that of the voltage drive circuit 33 of the NMOS Push Pull circuit 31 of FIG. 2, and the driver circuit 51 has a configuration in which the present technology is applied to the circuit on the output Hi side.

A control signal VIN is supplied to the gates of the PMOS transistor MP2, the NMOS transistor MN1, and the NMOS transistor NM4. On the other hand, a control signal VINB is supplied to the gates of the PMOS transistor MP1, the NMOS transistor MN2, and the NMOS transistor MN3. The control signal VIN and the control signal VINB are differential signals.

Thus, when the current drive circuit 61A outputs the predetermined current, the NMOS transistor MN1 is turned on, so that the termination resistance circuit 62A is connected to the transmission line 12A, and the termination resistance circuit 62A functions as the termination resistance on the transmission side. The termination resistance of the termination resistance circuit 62A is equal to characteristic impedance of the transmission line 12A. When the current drive circuit 61A does not output the predetermined current, the termination resistance circuit 62A is disconnected from the transmission line 12A. Similarly, when the current drive circuit 61B outputs the predetermined current, the NMOS transistor MN2 is turned on, so that the termination resistance circuit 62B is connected to the transmission line 12B, and the termination resistance circuit 62B functions as the termination resistance on the transmission side. The termination resistance of the termination resistance circuit 62B is equal to characteristic impedance of the transmission line 12B. When the current drive circuit 61B does not output the predetermined current, the termination resistance circuit 62B is disconnected from the transmission line 12B.

Figure 4:
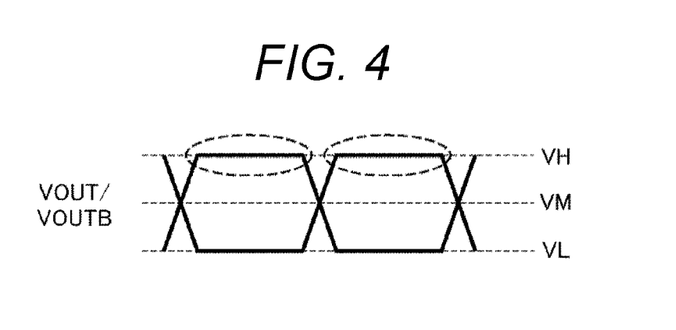
FIG. 4 is a diagram illustrating waveforms of differential signals VOUT and VOUTB output from the driver circuit of FIG. 3.

FIG. 4 illustrates waveforms of differential signals VOUT and VOUTB output from the driver circuit 51 of FIG. 3 to the differential transmission line 12.

The termination potential VT is set to a potential equal to a potential VH of the Hi level of the differential signals VOUT and VOUTB.

Referring again to FIG. 3, operation of the driver circuit 51 will be described.

In a case where the control signal VIN is set to Low and the control signal VINB is set to Hi, the PMOS transistor MP2 of the current drive circuit 61B, the NMOS transistor MN2 of the termination resistance circuit 62B, and the NMOS transistor MN3 of the voltage drive circuit 63A are turned on, so that a drive current It flows as illustrated in FIG. 3.

Here, in a case where single-ended characteristic impedance of the differential transmission line 12 is Zc and the termination resistances on the transmission and reception sides are matched with Zc, resistance of the termination circuit 13 on the reception side is 2×Zc, resistance of the termination resistance circuit 62B including the resistance R2 and the NMOS transistor MN2 is Zc, so that an output level VOUTB of the differential transmission line 12 is VOUTB=It×3×Zc. Assuming It=2 mA and Zc=50Ω, the output level is VOUTB=0.3 V. At this time, since the termination potential VT is also set to 0.3 V that is the same as the output potential VOUTB at the time of current output, the current flowing through the PMOS transistor MP2 of the current drive circuit 61B does not flow to the termination resistance circuit 62B. In other words, like the open-drain, all of the drive current can be caused to flow through the differential transmission line 12.

As described above, according to the driver circuit 51 of FIG. 3, due to the termination resistance circuit 62B, all of the drive current can be caused to flow through the differential transmission line 12, and the driver circuit 51 can be made to have a transmission side termination function for suppressing noise caused by reflection and the like in the differential transmission line 12.

The termination resistance circuit 62A similarly functions in a case where the control signal VIN is set to Hi and the control signal VINB is set to Low.

In the CML circuit 11 of FIG. 1, since the termination resistance 23 is connected to the power supply or the ground, a large current flows through the termination resistance 23; however, in the driver circuit 51 to which the present technology is applied, the current does not flow through the termination resistance circuits 62A and 62B that are termination resistances, and all of the drive current can be caused to flow into the differential transmission line 12.

Furthermore, since the current drive circuits 61A and 61B respectively include the PMOS transistors MP1 and MP2, the Hi level can be raised to a level close to the power supply voltage.

<4. Second Embodiment of Driver Circuit>

Figure 5:
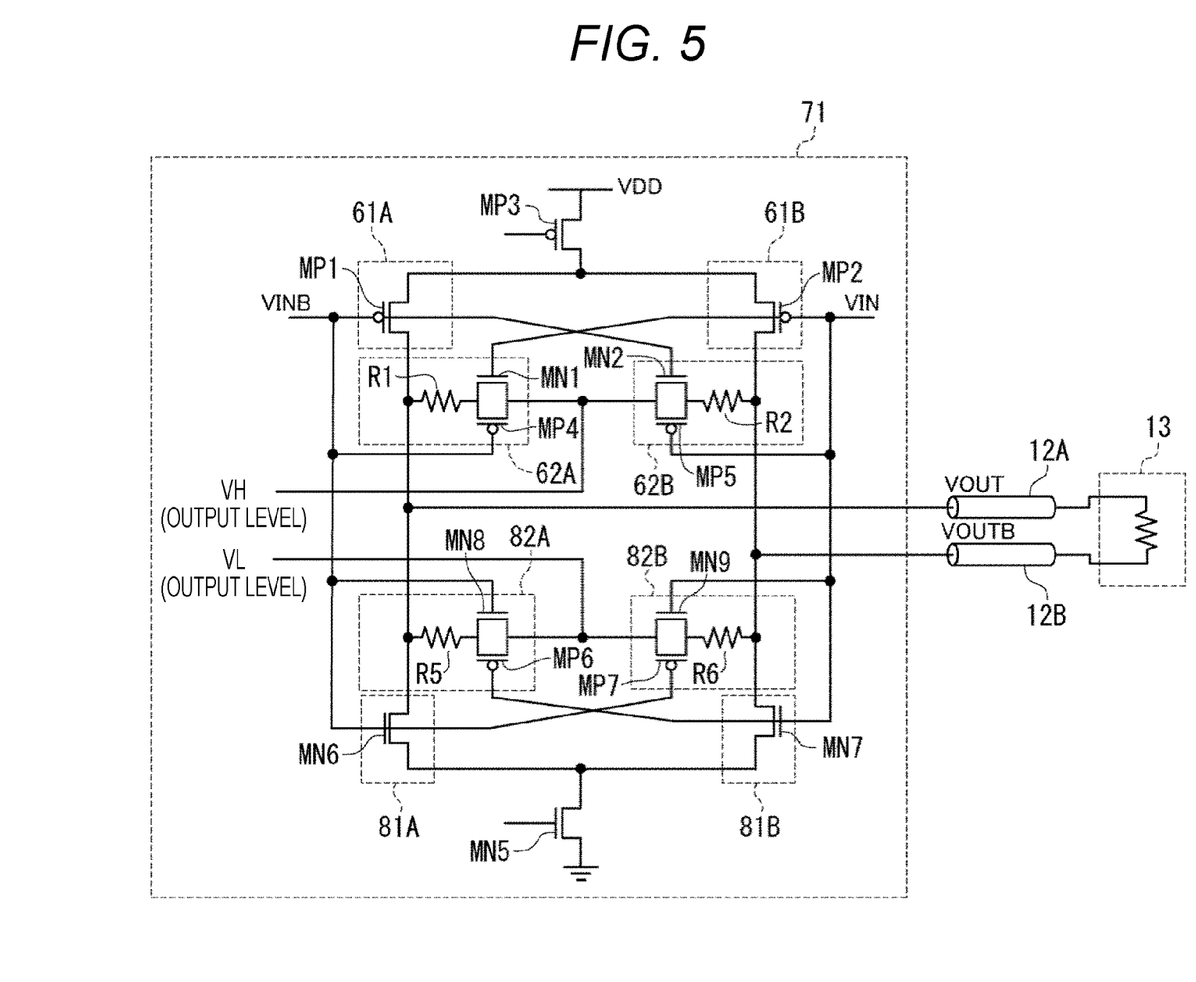
FIG. 5 is a diagram illustrating a configuration example of a second embodiment of the driver circuit to which the present technology is applied.

FIG. 5 illustrates a configuration example of a second embodiment of the driver circuit to which the present technology is applied.

In FIG. 5, parts corresponding to those of the first embodiment illustrated in FIG. 3 are denoted by the same reference numerals, and the description thereof will be omitted as appropriate.

A driver circuit 71 of the second embodiment illustrated in FIG. 5 is roughly a circuit in which the configuration adopted on the output Hi side of the first embodiment is also applied to the output Low side.

For the output Hi side of the driver circuit 71, a PMOS transistor MP3 as a current source is added between the power supply voltage VDD and the current drive circuits 61A and 61B. Furthermore, in the termination resistance circuit 62A, in addition to the NMOS transistor MN1, a PMOS transistor MP4 is added as a switch. In the termination resistance circuit 62B, similarly, in addition to the NMOS transistor MN2, a PMOS transistor MP5 is added as a switch. A connection point connecting the NMOS transistor MN1 and PMOS transistor MP4 with the NMOS transistor MN2 and PMOS transistor MP5 is connected to a termination potential VH, and the termination potential VH is equal to a potential of the Hi level of the output signal. The control signal VINB is supplied to the gate of the PMOS transistor MP4, and the control signal VIN is supplied to the gate of the PMOS transistor MP5.

Similarly to the output Hi side, the output Low side of the driver circuit 71 includes an NMOS transistor MN5 as a current source, a pair of current drive circuits 81A and 81B, and a pair of termination resistance circuits 82A and 82B.

The current drive circuit 81A includes an NMOS transistor MN6, and the current drive circuit 61B includes an NMOS transistor MN7. Each of the NMOS transistors MN6 and MN7 operates in the saturation region. By constituting the transistors included in the current drive circuits 81A and 81B by NMOS transistors, the low level of the output signal can be lowered to a level close to the ground.

The termination resistance circuit 82A includes a resistance R5, and an NMOS transistor MN8 and a PMOS transistor MP6 as switches, and the termination resistance circuit 82B includes a resistance R6, and an NMOS transistor MN9 and a PMOS transistor MP7 as switches. Each of the NMOS transistors MN8 and NM9 and the PMOS transistors MP6 and MP7 operates in the linear region.

The control signal VIN is supplied to the gates of the NMOS transistor MN7, the PMOS transistor MP6, and the NMOS transistor NM9. The control signal VINB is supplied to the gates of the NMOS transistor MN6, the PMOS transistor MP7, and the NMOS transistor MN8.

When the NMOS transistor MN8 or the PMOS transistor MP6 is turned ON, the termination resistance circuit 82A constitutes a termination resistance on the transmission side together with the resistance R5. Similarly, when the NMOS transistor MN9 or the PMOS transistor MP7 is turned ON, the termination resistance circuit 82B constitutes a termination resistance on the transmission side together with the resistance R6. A connection point connecting the NMOS transistor MN8 and PMOS transistor MP6 with the NMOS transistor MN9 and PMOS transistor MP7 is connected to a termination potential VL, and the termination potential VL is equal to a potential of the low level of the output signal.

Similarly to the driver circuit 51 of the first embodiment, also in the driver circuit 71 having the above configuration, all of the drive current can be caused to flow through the differential transmission line 12, and the driver circuit 71 can be made to have a transmission side termination function for suppressing noise caused by reflection and the like in the differential transmission line 12.

<5. Third Embodiment of Driver Circuit>

Figure 6:
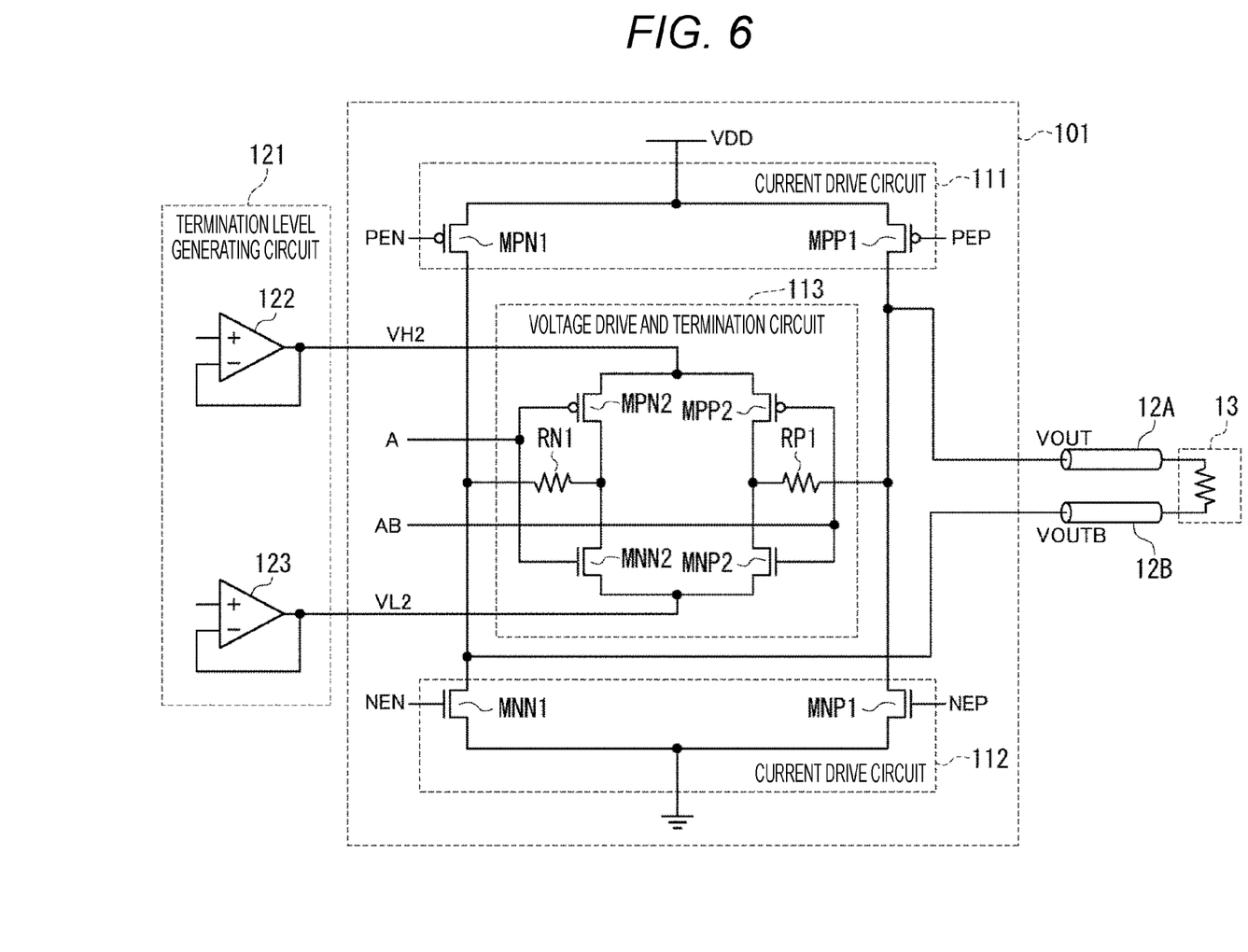
FIG. 6 is a diagram illustrating a configuration example of a third embodiment of the driver circuit to which the present technology is applied.

FIG. 6 illustrates a configuration example of a third embodiment of the driver circuit to which the present technology is applied.

A driver circuit 101 in FIG. 6 is a circuit having an emphasis function to compensate for transmission line loss by combining current drive having a signal level termination resistance function of the present technology and voltage drive.

Figure 7:
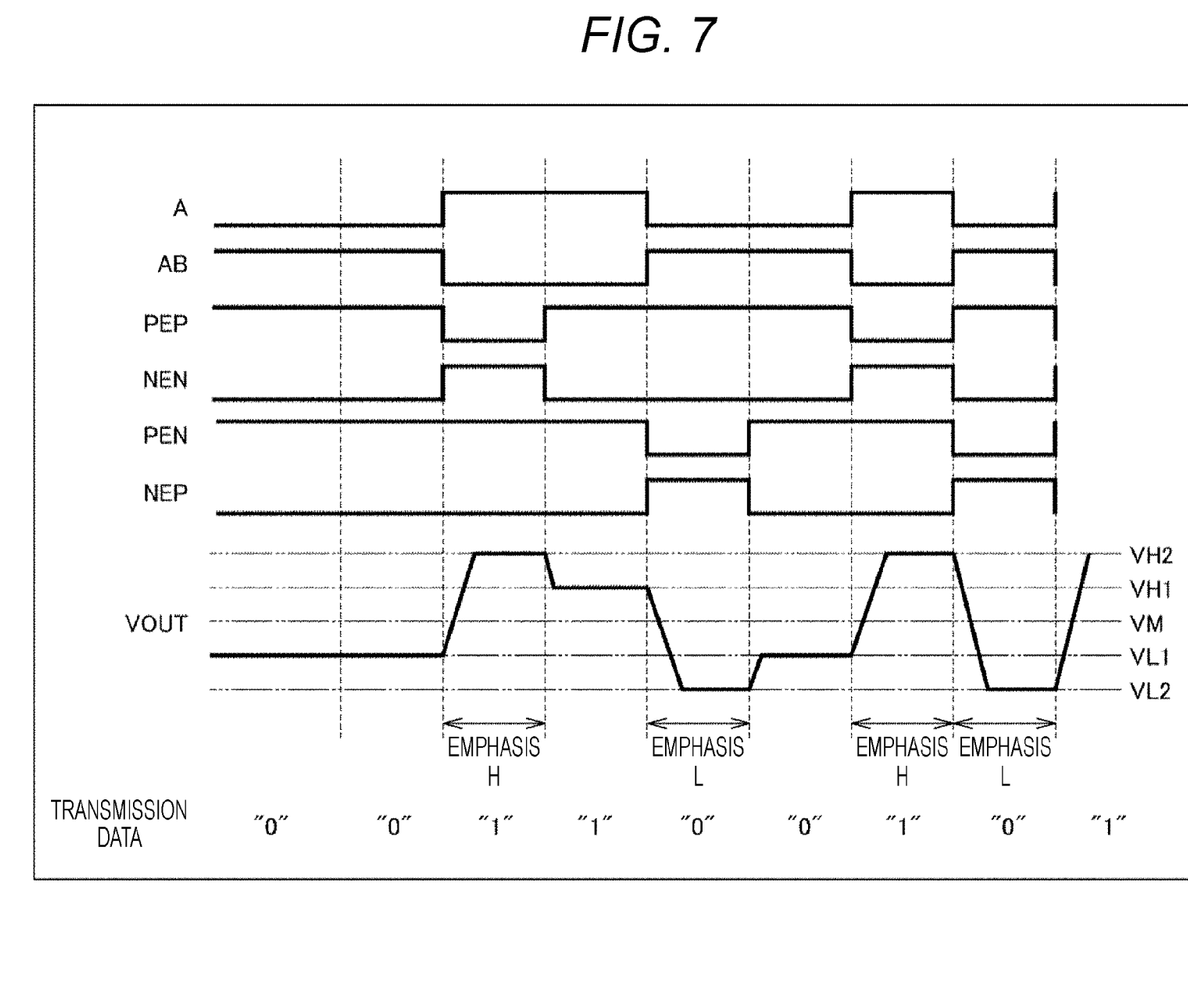
FIG. 7 is a timing chart illustrating operation of the driver circuit of FIG. 6.

FIG. 7 is a timing chart illustrating operation of the driver circuit 101 of FIG. 6.

When there is no signal transition, the driver circuit 101 outputs a signal having an amplitude VH1 in the case of Hi, and outputs a signal having an amplitude VL1 in the case of Low. On the other hand, in a case where there is a signal transition, in other words, in a case where the signal level is changed from the previous state and Hi is transmitted, the driver circuit 101 outputs a signal having an amplitude VH2 (emphasis Hi) larger than the amplitude VH1, and in a case where the signal level is changed from the previous state and Low is transmitted, the driver circuit 101 outputs a signal of the amplitude VL2 (emphasis Low) smaller than the amplitude VL1.

FIG. 7 illustrates control signals supplied to transistors of the driver circuit 101 and the output level VOUT in a case where the driver circuit 101 transmits "0, 0, 1, 1, 0, 0, 1, 0, 1" as transmission data transmitted via the transmission line 12A.

Referring back to FIG. 6, the driver circuit 101 includes a current drive circuit 111 on the output Hi side, a current drive circuit 112 on the output Low side, and a voltage drive and termination circuit 113 serving as both a termination circuit at the time of current drive and a voltage drive circuit.

The current drive circuit 111 on the output Hi side includes PMOS transistors MPN1 and MPP1 constituting a differential pair, and is connected to the power supply voltage VDD. A control signal PEN is supplied to the gate of the PMOS transistor MPN1, and a control signal PEP is supplied to the gate of the PMOS transistor MPP1.

The current drive circuit 112 on the output Low side includes NMOS transistors MNN1 and MNP1 constituting a differential pair, and is connected to the ground. A control signal NEN is supplied to the gate of the NMOS transistor MNN1, and a control signal NEP is supplied to the gate of the NMOS transistor MNP1.

The voltage drive and termination circuit 113 includes a PMOS transistor MPP2, an NMOS transistor MNP2, and a resistance RP1 serving as a termination resistance on the transmission line 12A side, and a PMOS transistor MPN2, an NMOS transistor MNN2, and a resistance RN1 serving as a termination resistance on the transmission line 12B side. The PMOS transistor MPP2 and the NMOS transistor MNP2 constitute a differential pair, and the PMOS transistor MPN2 and the NMOS transistor MNN2 constitute a differential pair.

A control signal AB is supplied to the gates of the PMOS transistor MPP2 and the NMOS transistor MNP2, and a control signal A is supplied to the gates of the PMOS transistor MPN2 and the NMOS transistor MNN2.

A potential VH2 generated by a voltage regulator 122 of a termination level generating circuit 121 is supplied to the sources of the PMOS transistors MPP2 and MPN2. A potential VL2 generated by a voltage regulator 123 of the termination level generating circuit 121 is supplied to the sources of the NMOS transistors MNP2 and MNN2.

In a steady state where there is no signal transition, the voltage drive and termination circuit 113 operates as a voltage drive circuit, generates output signals having amplitudes VH1 and VL1 (VL1<VH1), and outputs the output signals to the differential transmission line 12.

Furthermore, at the time of the signal transition, the current drive circuits 111 and 112 generate output signals having amplitudes VH1 and VL1 that are larger than the amplitudes VH1 and VL1 (VH1<VH2, VL2<VL1), and output the output signals to the differential transmission line 12. At this time, the voltage drive and termination circuit 113 is kept to be turned on and functions as a termination circuit. The PMOS transistor MPN2 has a role of a switch of a termination resistance circuit of the PMOS transistor MPN1, the PMOS transistor MPP2 has a role of a switch of a termination resistance circuit of the PMOS transistor MPP1, the NMOS transistor MNN2 has a role of a switch of a termination resistance circuit of the NMOS transistor MNN1, and the NMOS transistor MNP1 has a role of a switch of a termination resistance circuit of the NMOS transistor MNP2.

<6. Fourth Embodiment of Driver Circuit>

Figure 8:
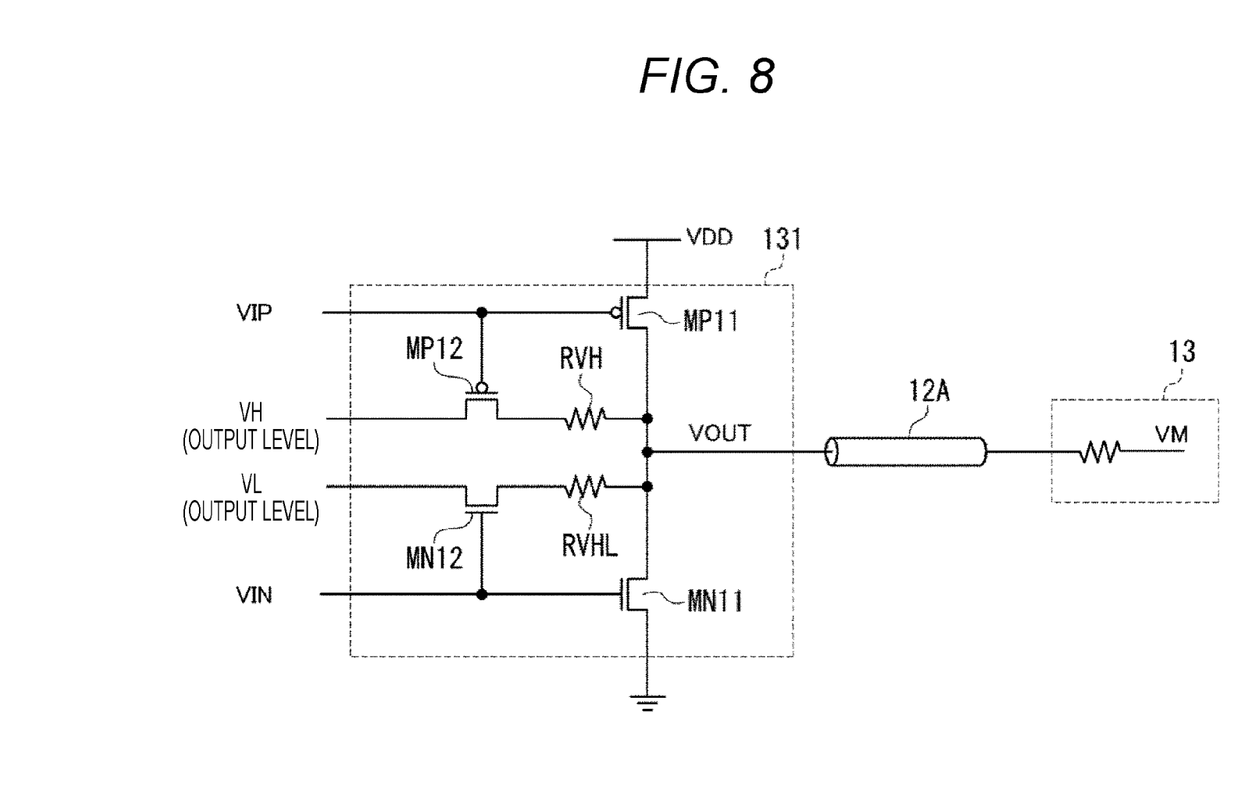
FIG. 8 is a diagram illustrating a configuration example of a fourth embodiment of the driver circuit to which the present technology is applied.

FIG. 8 illustrates a configuration example of a fourth embodiment of the driver circuit to which the present technology is applied.

The fourth embodiment illustrates an example in which the present technology is applied to a single-ended output driver circuit.

A driver circuit 131 in FIG. 8 includes a PMOS transistor MP11 that is a current source circuit, and a PMOS transistor MP12 and a resistance RVH connected together in series. When the PMOS transistor MP12 as a switch is turned on, the PMOS transistor MP12 and the resistance RVH connected together in series function as a termination resistance on the transmission side. A control signal VIP is supplied to the gates of the PMOS transistors MP11 and MP12, the source of the PMOS transistor MP11 is connected to the power supply voltage VDD, and the source of the PMOS transistor MP12 is connected to the termination potential VH. The PMOS transistor MP12 and the resistance RVH connected together in series are connected in parallel with the PMOS transistor MP11.

Furthermore, the driver circuit 131 includes an NMOS transistor MN11 that is a current sink circuit, and an NMOS transistor MN12 and a resistance RVHL connected together in series. When the NMOS transistor MN12 as a switch is turned on, the NMOS transistor MN12 and the resistance RVHL connected together in series function as a termination resistance on the transmission side. The control signal VIN is supplied to the gates of the NMOS transistors MN11 and MN12, the source of the NMOS transistor MN11 is connected to the ground, and the source of the NMOS transistor MN12 is connected to the termination potential VL. The NMOS transistor MN12 and the resistance RVHL connected together in series are connected in parallel with the NMOS transistor MN11.

The output of the driver circuit 131 configured as described above is connected to the termination circuit 13 on the reception side via one transmission line 12A. The driver circuit 71 of FIG. 5 corresponds to a circuit in which two driver circuits 131 are provided to correspond to the two transmission lines 12A and 12B that are the differential transmission line 12 and the two driver circuits 131 are made to operate differentially.

<7. Fifth Embodiment of Driver Circuit>

Figure 9:
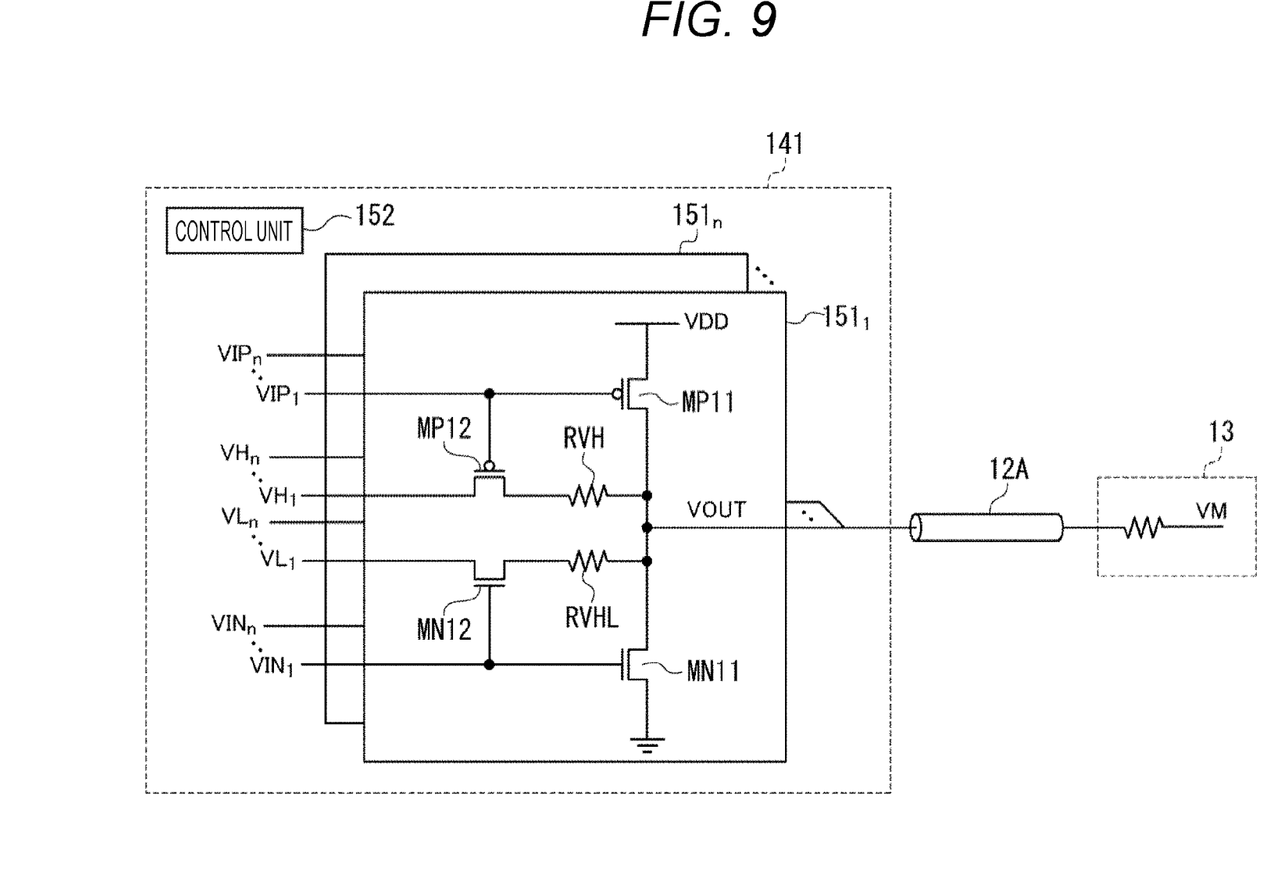
FIG. 9 is a diagram illustrating a configuration example of a fifth embodiment of the driver circuit to which the present technology is applied.

FIG. 9 illustrates a configuration example of a fifth embodiment of the driver circuit to which the present technology is applied.

A driver circuit 141 of FIG. 9 is a single-ended output driver circuit similar to that of FIG. 8, and has a configuration in which n single-ended circuits 151 are prepared having the same configuration as the driver circuit 131 of FIG. 8, and the n single-ended circuits $151_1$ to $151_n$ are connected together in parallel.

A control unit 152 determines which one of the n single-ended circuits $151_1$ to $151_n$ to use, and controls control signals $VIP_1$ to $VIP_n$ and control signals $VIN_1$ to $VIN_n$ to be supplied to the single-ended circuits $151_1$ to $151_n$. For example, termination potentials $VL_1$ to $VL_n$ and termination potentials $VH_1$ to $VH_n$ of the n single-ended circuits $151_1$ to $151_n$ are set to different voltages, such as $VL_1<VL_2<VL_3< \ldots <VL_n$, and $VH_1<VH_2<VH_3< \ldots <VH_n$, and one of the single-ended circuits $151_1$ to $151_n$ is appropriately selected, whereby an emphasis function can be implemented.

<8. Sixth Embodiment of Driver Circuit>

Figure 10:
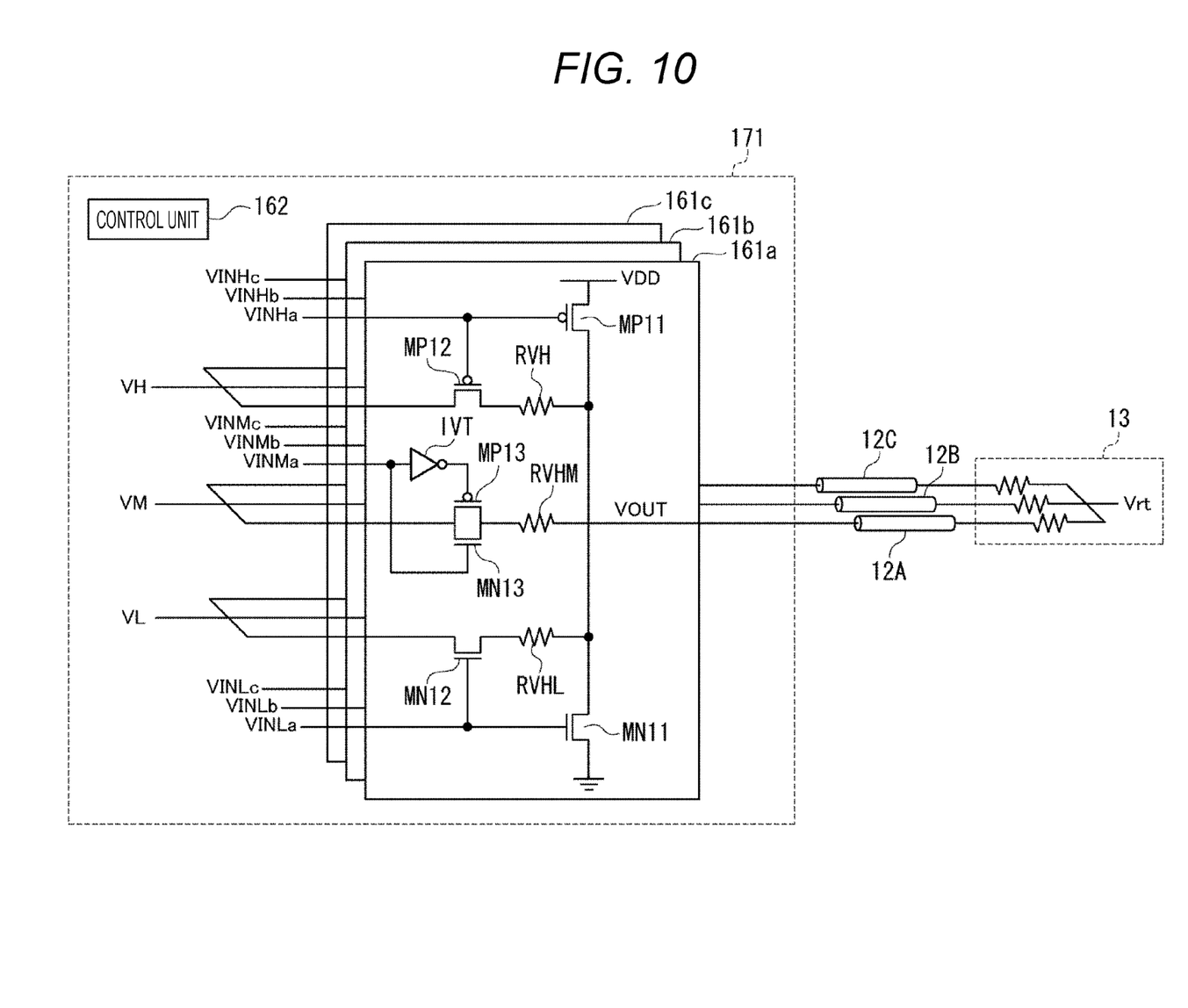
FIG. 10 is a diagram illustrating a configuration example of a sixth embodiment of the driver circuit to which the present technology is applied.

FIG. 10 illustrates a configuration example of a sixth embodiment of the driver circuit to which the present technology is applied.

The sixth embodiment illustrates an example in which the present technology is applied to a driver circuit of a 3-line complementary output. Here, the 3-line complementary output refers to an output at which the sum of output signals of three lines is constant (for example, zero).

A driver circuit 171 of FIG. 10 includes three single-ended circuits 161a to 161c, and a control unit 162 that controls the circuits.

The single-ended circuit 161a includes the PMOS transistor MP11 that is a current source circuit, and the PMOS transistor MP12 and the resistance RVH connected together in series that are similar to those of the driver circuit 131 of FIG. 8. A control signal VINHa is supplied to the gates of the PMOS transistors MP11 and MP12, the source of the PMOS transistor MP11 is connected to the power supply voltage VDD, and the source of the PMOS transistor MP12 is connected to the termination potential VH.

Furthermore, the single-ended circuit 161a includes the NMOS transistor MN11 that is a current sink circuit, and the NMOS transistor MN12 and the resistance RVHL connected together in series that are similar to those of the driver circuit 131 of FIG. 8. A control signal VINLa is supplied to the gates of the NMOS transistors MN11 and MN12, the source of the NMOS transistor MN11 is connected to the ground, and the source of the NMOS transistor MN12 is connected to the termination potential VL.

Moreover, the single-ended circuit 161a includes a PMOS transistor MP13 and an NMOS transistor MN13 as switches, and a resistance RVHM connected in series with the transistors. A control signal VINMa is supplied to the gate of the NMOS transistor MN13, and an inverted signal of the control signal VINMa inverted by an inverter IVT is supplied to the gate of the PMOS transistor MP13. The other end different from one end of the resistance RVHM connected to the PMOS transistor MP13 and the NMOS transistor MN13 is connected to the drains of the PMOS transistor MP11 and the NMOS transistor MN11.

In accordance with the control of the control unit 162, the single-ended circuit 161a outputs a signal of the output potential VOUT equal to any of the termination potential VH (first level), VM (second level), or VL (third level) (VL<VM<VH) to the transmission line 12A.

The single-ended circuit 161b is configured similarly to the single-ended circuit 161a, except that the control signals VINHa, VINMa, and VINLa in the single-ended circuit 161a are replaced by control signals VINHb, VINMb, and VINLb, respectively. In accordance with the control of the control unit 162, the single-ended circuit 161b outputs a signal of the output potential VOUT equal to any of the termination potential VH, VM, or VL to the transmission line 12B.

The single-ended circuit 161c is configured similarly to the single-ended circuit 161a, except that the control signals VINHa, VINMa, and VINLa in the single-ended circuit 161a are replaced by control signals VINHc, VINMc, and VINLc, respectively. In accordance with the control of the control unit 162, the single-ended circuit 161c outputs a signal of the output potential VOUT equal to any of the termination potential VH, VM or VL to the transmission line 12C.

The single-ended circuits 161a to 161c constitute a complementary circuit, and the control unit 162 controls signal levels of the control signals VINHa to VINHc, VINMa to VINMc, and VINLa to VINLa so that each of the output signal of the single-ended circuit 161a, the output signal of the single-ended circuit 161b, and the output signal of the single-ended circuit 161c is not at the same potential as that of any of the other output signals (is exclusive), and the sum of the output signals is constant (for example, zero).

The driver circuit 171 of the 3-line complementary output configured as described above can be applied to transmission conforming to mobile industry processor interface (MIPI) C-PHY that is an interface standard with a camera and a display of a mobile device, for example.

Figure 11:
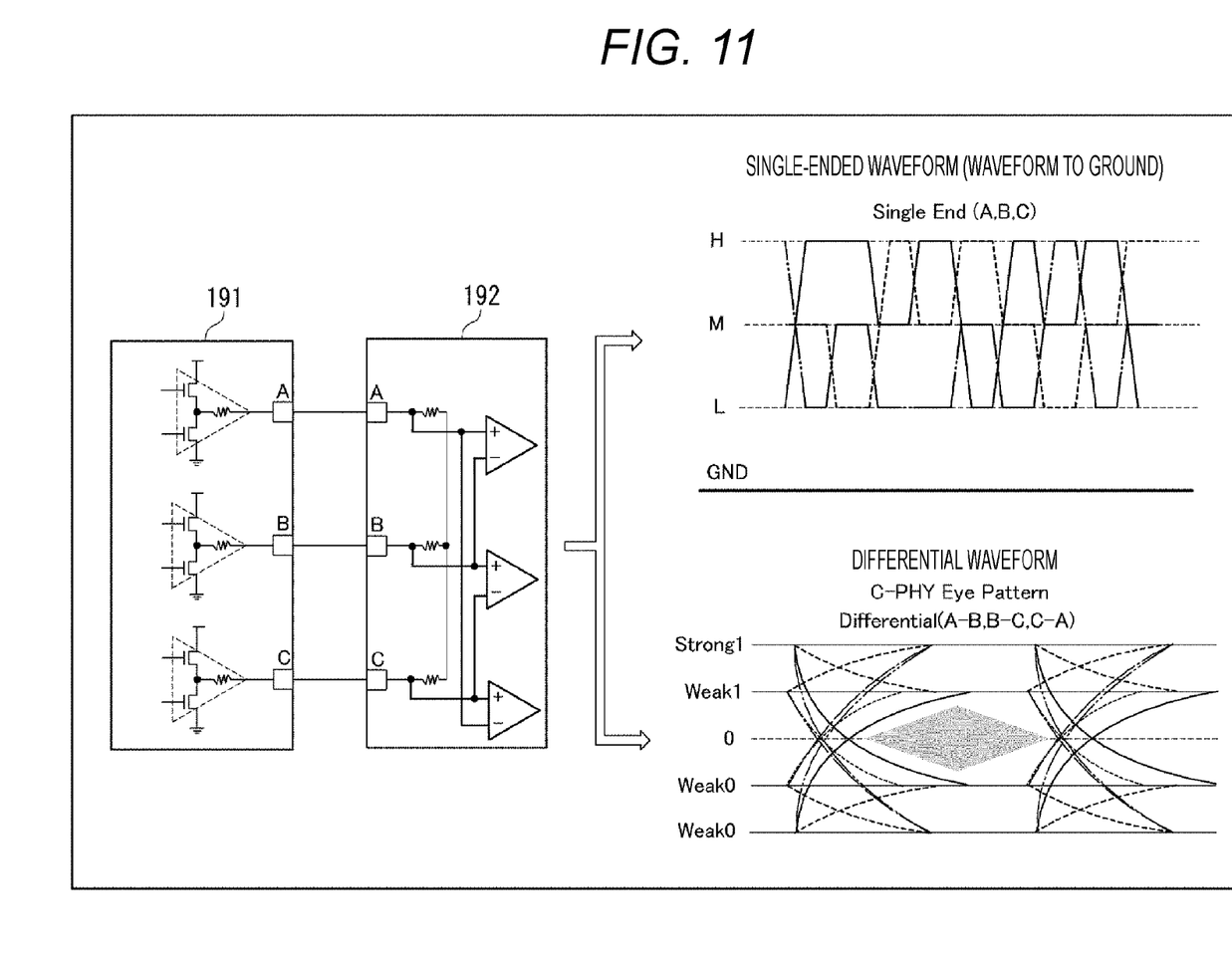
FIG. 11 is a diagram explaining an outline of MIPI C-PHY.

FIG. 11 is a diagram explaining an outline of MIPI C-PHY.

In MIPI C-PHY, a driver 191 and a receiver 192 are connected by three lines. The driver 191 exclusively outputs a signal of potential of H, M, or L (L<M<H) to the three lines. The receiver 192 generates differential signals of A–B, B–C, and C–A from the signals of potential of H, M, or L received by the three lines, and recognizes data transmitted on the basis of the differential signals generated. The voltage of the differential signal takes one of four levels of "Strong 1", "Weak 1", "Weak 0", or "Strong 0".

By using the driver circuit 171 of FIG. 10 capable of outputting a large amplitude signal with low power consumption for the transmission of MIPI C-PHY defined as described above, the transmission conforming to MIPI C-PHY can be applied to medium to long distance transmission.

Note that, FIGS. 10 and 11 illustrate examples of 3-line complementary outputs; however, the present technology can also be applied to complementary outputs of four or more lines in which the sum of output signals of the four or more lines is constant (for example, zero), of course.

<9. Overall Transmission/Reception Diagram>

Figure 12:
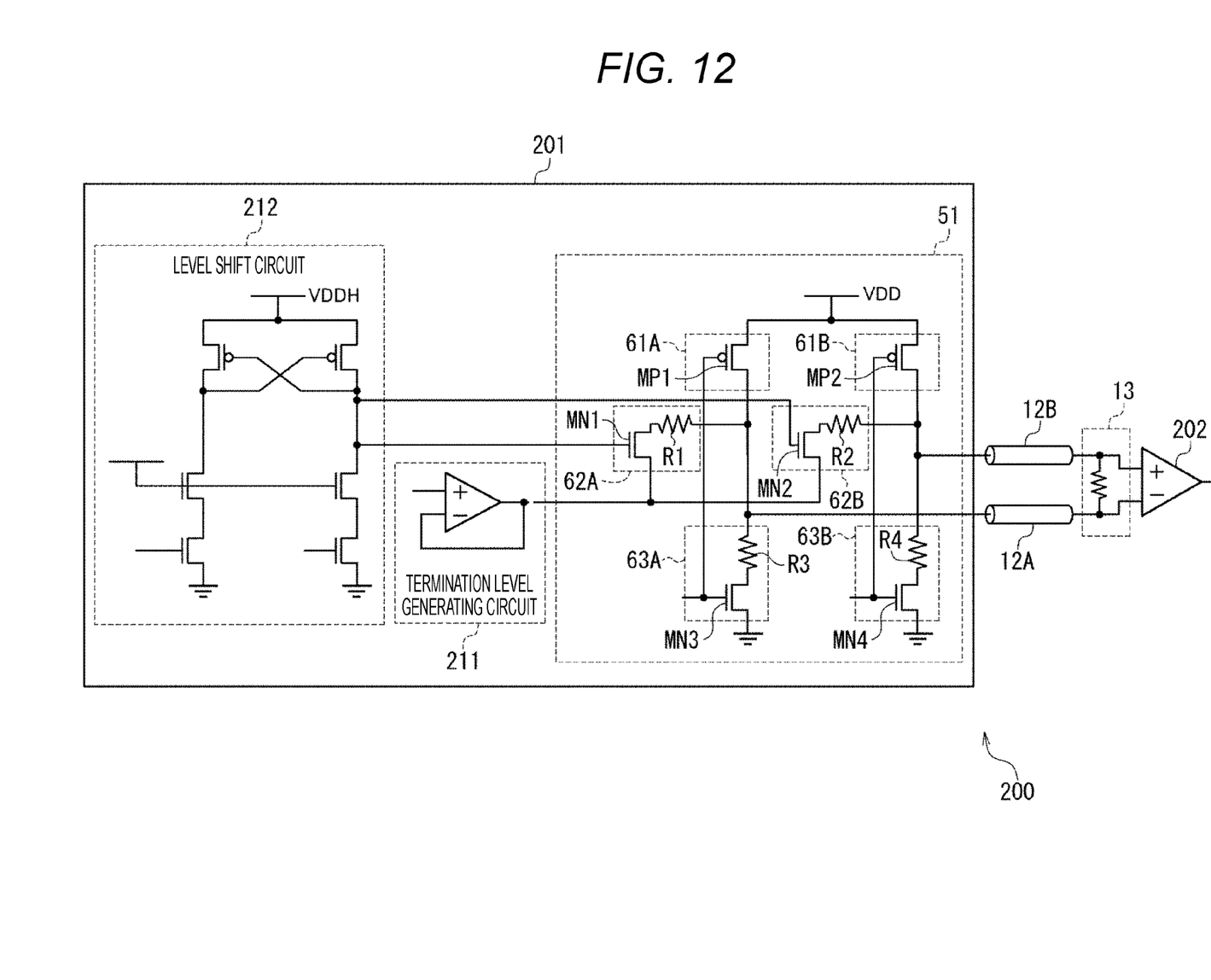
FIG. 12 is a circuit diagram of overall transmission and reception.

FIG. 12 illustrates a circuit diagram of overall transmission and reception including the driver circuit 51 described above.

A transmission/reception system 200 includes a transmission device 201 that transmits a differential signal, a reception device (receiver) 202 that receives the differential signal transmitted from the transmission device 201 via the differential transmission line 12 (transmission lines 12A and 12B).

The transmission device 201 includes the driver circuit 51, a termination level generating circuit 211, and a level shift circuit 212.

The termination level generating circuit 211 supplies the termination potential VT to the termination resistance circuits 62A and 62B of the driver circuit 51.

The level shift circuit 212 supplies a power supply voltage VDDH (VDD<VDDH) higher than the power supply voltage VDD in the driver circuit 51 to the gates of the NMOS transistors MN1 and MN2 of the termination resistance circuits 62A and 62B. When the level of the output signal becomes high, the NMOS transistors MN1 and MN2 that are the switches of the termination resistance circuits 62A and 62B are hard to be turned on, so that the level shift circuit 212 turns on and off the NMOS transistors MN1 and MN2 using the power supply voltage VDDH higher than the power supply voltage VDD.

The transmission device 201 can be constituted by one chip or module. Alternatively, the driver circuit 51 and the level shift circuit 212 excluding the termination level generating circuit 211 may be constituted by one chip or module.

FIG. 12 illustrates the transmission device 201 in which the driver circuit 51 is adopted, as an example of the driver circuit to which the present technology is applied; however, in addition to the driver circuit 51, for the driver circuits 71, 101, 131, 141, and 171, the device can also be configured similarly.

<10. Effect>

Figure 13:
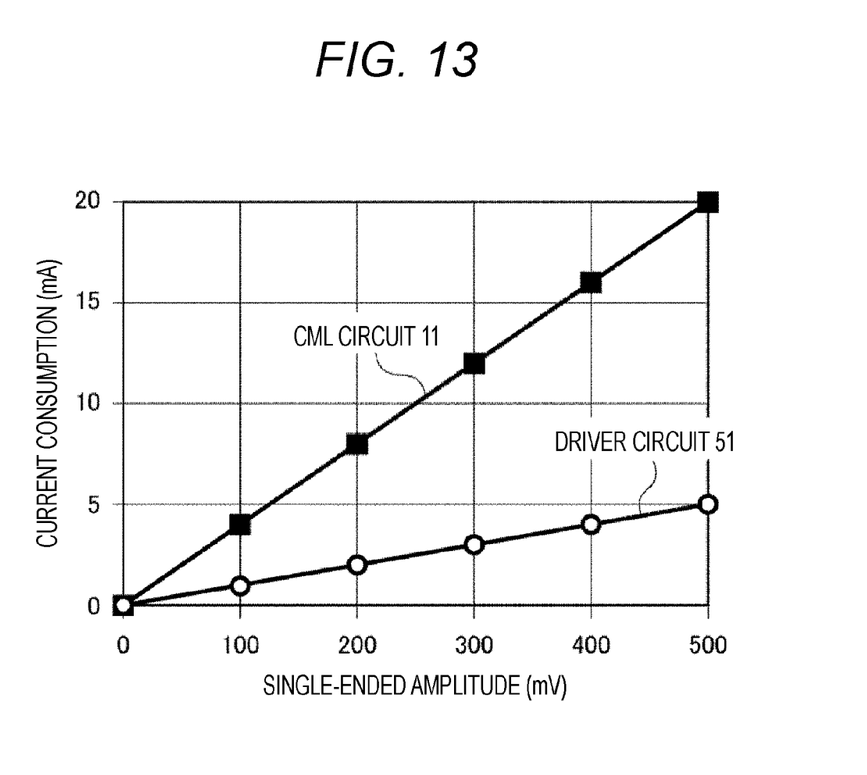
FIG. 13 is a diagram explaining a current consumption reduction effect according to the present technology.

With reference to FIG. 13, a current consumption reduction effect according to the present technology will be described.

FIG. 13 is a graph comparing the current consumption with respect to the amplitude of the single-ended signal between the CML circuit 11 of FIG. 1 and the driver circuit 51 of FIG. 3.

As is apparent from FIG. 13, according to the driver circuit 51 using the present technology, the current consumption effect is higher as compared with the CML circuit 11, and the effect becomes more prominent as the amplitude is larger.

<11. Summary>

As described above, according to the driver circuits of the first to sixth embodiments to which the present technology is applied, the PMOS transistor is used as the drive circuit on the current source side, whereby the signal amplitude can be raised to a power supply voltage level. Furthermore, the termination potential of the termination resistance circuit is matched with the output potential, whereby all of the drive current can be caused to flow through the transmission line like the open-drain. Furthermore, impedance matching with the transmission line can also be secured by the termination resistance circuit. Thus, it is possible to implement a large amplitude signal output required for long distance transmission with low power consumption.

Furthermore, since the driver circuits of the first to sixth embodiments can be implemented by CMOS circuits, the driver circuits are suitable for operation at a low power supply voltage.

The embodiment of the present technology is not limited to the embodiments described above, and various modifications are possible without departing from the scope of the present technology.

For example, a mode can be adopted in which some or all of the above-described plurality of embodiments described above are combined.

Note that, the effects described in the present specification are merely examples and are not limited, and may have effects other than those described in the present specification.

In the present specification, a system means an aggregation of a plurality of constituents (device, module (component), and the like), and it does not matter whether or not all of the constituents are in the same cabinet. Therefore, a plurality of devices that is accommodated in a separate cabinet and connected to each other via a network and one device that accommodates a plurality of modules in one cabinet are both systems.

Note that, the present technology can also be configured as described below.

(1)

A driver circuit including:

a current drive circuit that outputs a predetermined current; and a termination resistance circuit connected in parallel with the current drive circuit, in which the termination resistance circuit connects a termination resistance to a transmission line when the current drive circuit outputs a current, and disconnects the termination resistance from the transmission line when the current drive circuit does not output the current.

(2)

The driver circuit according to (1), in which a termination potential of the termination resistance circuit is equal to an output potential to the transmission line when the current drive circuit outputs the current.

(3)

The driver circuit according to (1) or (2), in which the termination resistance is equal to a characteristic impedance of the transmission line.

(4)

The driver circuit according to any of (1) to (3), further including a plurality of circuits each including the current drive circuit and the termination resistance circuit, in which the plurality of circuits operates differentially.

(5)

The driver circuit according to any of (1) to (4), in which the termination resistance circuit also serves as a voltage drive circuit, and the termination resistance circuit functions as the voltage drive circuit in a steady state where there is no signal transition, and functions as the termination resistance at time of the signal transition.

(6)

The driver circuit according to any of (1) to (3), further including a plurality of circuits connected together in parallel, the plurality of circuits each including the current drive circuit and the termination resistance circuit.

(7)

The driver circuit according to (6), in which the plurality of circuits respectively has different termination potentials of the termination resistance circuits.

(8)

The driver circuit according to any of (1) to (3), further including three or more circuits each including the current drive circuit and the termination resistance circuit, in which a sum of output signals of the three or more circuits is constant.

(9)

The driver circuit according to (8), in which three of the circuits are included, and the three circuits each exclusively output signals having potentials of a first level, a second level, and a third level, as the output signals, where the first level is greater than the second level and the second level is greater than the third level.

(10)

The driver circuit according to any of (1) to (9), in which the current drive circuit includes a transistor, and the termination resistance circuit includes a transistor and a resistance.

(11)

A method for controlling a driver circuit, the driver circuit including: a current drive circuit that outputs a predetermined current; and a termination resistance circuit connected in parallel with the current drive circuit, the method including connecting a termination resistance to a transmission line when the current drive circuit outputs a current, and disconnecting the termination resistance from the transmission line when the current drive circuit does not output the current, by the termination resistance circuit.

(12)

A transmission/reception system including a transmission device and a reception device, in which the transmission device includes:

a current drive circuit that outputs a predetermined current; and a termination resistance circuit connected in parallel with the current drive circuit, the termination resistance circuit connects a termination resistance to a transmission line when the current drive circuit outputs a current, and disconnects the termination resistance from the transmission line when the current drive circuit does not output the current.

REFERENCE SIGNS LIST

51 Driver circuit
61A, 61B Current drive circuit
62A, 62B Termination resistance circuit
71 Driver circuit
81A, 81B Current drive circuit
82A, 82B Termination resistance circuit
101 Driver circuit
111, 112 Current drive circuit
113 Voltage drive and termination circuit
121 Termination level generating circuit
131, 141 Driver circuit
$151_1$ to $151_n$, $161a$ to $161c$ Single-ended circuit
162 Control unit
171 Driver circuit
200 Transmission/reception system
201 Transmission device
202 Reception device

The invention claimed is:

1. A driver circuit comprising:
a current drive circuit comprising a first switch, the first switch is controllable by a first signal in a manner that permits the first switch to:
electrically connect, directly to a node, a power supply, and
electrically disconnect, from the node, the power supply;
a termination resistance circuit comprising a second switch, the second switch is controllable by a second signal in a manner that permits the second switch to:
establish an electrical connection from the node, through a termination resistance, to a termination potential, and
obstruct the electrical connection,
wherein the second signal is a non-delayed inverted signal of the first signal.

2. The driver circuit according to claim 1, wherein the termination resistance is between the node and the second switch, the second switch and the node are electrically connected directly to the termination resistance.

3. The driver circuit according to claim 1, wherein the second switch is controllable by the second signal in a manner that permits the second switch to establish the electrical connection when the first switch electrically connects the power supply to the node.

4. The driver circuit according to claim 1, wherein the second switch is controllable by the second signal in a manner that permits the second switch to obstruct the electrical connection when the first switch electrically disconnects the power supply from the node.

5. The driver circuit according to claim 1, wherein the node terminates a transmission line.

6. The driver circuit according to claim 5, wherein the termination resistance is equal to a characteristic impedance of the transmission line.

7. The driver circuit according to claim 5, wherein the termination potential is equal to an output potential to the transmission line.

8. A transmission/reception system comprising:
the driver circuit according to claim 5; and
a reception device that is electrically connected to the transmission line.

* * * * *